US006703885B1

(12) United States Patent
Fan et al.

(10) Patent No.: US 6,703,885 B1
(45) Date of Patent: Mar. 9, 2004

(54) TRIMMER METHOD AND DEVICE FOR CIRCUITS

(75) Inventors: Cheng-Hsuan Fan, Hsin-Chu Hsien (TW); Jing-Meng Liu, Hsin-Chu (TW)

(73) Assignee: Richtek Technology Corp., Chupei (TW)

( * ) Notice: Subject to any disclaimer, the term of this patent is extended or adjusted under 35 U.S.C. 154(b) by 0 days.

(21) Appl. No.: 10/245,390

(22) Filed: Sep. 18, 2002

(51) Int. Cl.[7] .................................................. H03L 5/00
(52) U.S. Cl. ....................................... 327/308; 327/525
(58) Field of Search ................................ 327/308, 530, 327/534, 535, 540, 525

(56) References Cited

U.S. PATENT DOCUMENTS 5,450,030 A * 9/1995 Shin et al. .................. 327/525
5,734,274 A * 3/1998 Gavish ........................ 327/48

* cited by examiner

*Primary Examiner*—Jeffrey Zweizig
(74) *Attorney, Agent, or Firm*—Hunton & Williams LLP

(57) ABSTRACT

In a trimmer method and device, a reference signal of a target circuit is compared with a test signal, and a binary count output is generated according to result of the comparison. Thereafter, according to logic states of bits of the binary count output, electrical conduction through passive components that are coupled to the target circuit and that correspond respectively to the bits of the binary count output are selectively enabled and disabled so as to adjust the reference signal. The above steps are repeated by varying the binary count output until the reference signal approximates the test signal. Thereafter, fuses coupled to the passive components are melted selectively in a single fuse-melting operation so as to maintain the enabled and disabled states of electrical conduction through the passive components in order to set the reference signal to be approximate to the test signal.

21 Claims, 6 Drawing Sheets

TRIMMER METHOD AND DEVICE FOR CIRCUITS

BACKGROUND OF THE INVENTION

1. Field of the Invention

The invention relates to a trimmer method and device for circuits, more particularly to a trimmer method and device that can facilitate adjustment of a reference signal of a circuit.

2. Description of the Related Art

In the process of fabricating integrated circuits, since it is impossible to achieve 100% precision, electrical characteristics, such as resistance and capacitance values and transistor gain, of an actual fabricated circuit usually vary from ideal values in a circuit design. The differences in electrical characteristics can result in drawbacks, such as lower operating efficiency and improper circuit operation.

Due to manufacturing, time and monetary constraints, it is not possible to conduct adjustment for each and every component of a fabricated circuit. It is noted that, for an analog circuit, what is important is to maintain the values of reference parameters, such as reference voltage and reference frequency. As to how reference parameters can be adjusted after fabrication to meet actual design requirements is an important topic in the manufacturing industry.

FIG. 1 illustrates a conventional programmable trimmer device 5 for the adjustment of a reference voltage ($V_F$) of a target circuit 4. The trimmer device includes a series connection of three resistors 51, 52, 53, and three fuses 51A, 52A, 53A, each of which is coupled across a respective one of the resistors 51, 52, 53. By virtue of the fuses 51A, 52A, 53A, electrical conduction through each of the resistors 51, 52, 53 can be enabled or disabled, respectively. Particularly, when the fuses 51A, 52A, 53A are short-circuited, the resistors 51, 52, 53 will be bypassed, and no voltage drop will be present across the latter. On the other hand, when one of the fuses 51A, 52A, 53A is open-circuited, such as by melting, electrical conduction through the respective one of the resistors 51, 52, 53 will be enabled so as to result in a corresponding voltage drop across the same. In the following example, it is assumed that each of the resistors 51, 52, 53 has a resistance of 10 ohms, and that prior to open-circuiting of any of the fuses 51A, 52A, 53A, the current flowing through each of the fuses 51A, 52A, 53A is 1 mA. Therefore, when the reference voltage ($V_F$) is lower than the design value by 0.02V, the reference voltage ($V_F$) can be increased by 0.02V in the following manner: open-circuiting the fuse 53A to increase the reference voltage ($V_F$) by 0.01V, and subsequently open-circuiting the fuse 52A to further increase the reference voltage ($V_F$) by another 0.01V. FIG. 2 illustrates another conventional programmable trimmer device 6 which operates in a manner similar to the conventional programmable trimmer device 5 of FIG. 1. Unlike the trimmer device 5 of FIG. 1, the trimmer device 6 includes a parallel connection of three resistors 61, 62, 63, and three fuses 61A, 62A, 63A, each of which is coupled in series to a respective one of the resistors.61, 62, 63.

In the conventional programmable trimmer devices 5, 6, there is a need to couple the fuses 51A, 52A, 53A, 61A, 62A, 63A to pads (P1, P2, P3, T) . Before the packaging stage of the target circuit 4, the pad (T) is coupled to a tester (not shown), and energy in the form of a voltage or current signal for melting a selected one of the fuses is conducted through a respective one of the pads (P1, P2, P3). Because adjustment of the reference voltage ($V_F$) in the conventional programmable trimmer devices 5, 6 requires repeated testing and fuse-melting steps, the adjustment operation is slow and inconvenient to conduct. Moreover, in order to increase the adjustment precision of the reference voltage ($V_F$), there is a need to provide a large number of resistors and fuses, which results Ian corresponding increase in the required number of pads. The large number of allocated pads results in an undesirable increase in the size of the integrated circuit. Furthermore, because the pads have high impedance characteristics, the presence of numerous pads can lead to noise reception during testing of the target circuit 4, which can result in instability of the latter.

SUMMARY OF THE INVENTION

Therefore, the main object of the present invention is to provide a trimmer method and device that permits automatic adjustment of a reference signal.

Another object of the present invention is to provide a trimmer method and device that permits automatic selection of fuses to be melted and that further permits simultaneous melting of the selected fuses in a single fuse-melting operation so as to set a reference signal to an adjusted level.

A further object of the present invention is to provide a trimmer method and device that utilizes a relatively small number of pads to avoid an undesirable increase in size and to minimize noise reception when applied to integrated circuits.

According to one aspect of the invention, a trimmer method comprises:

a) comparing a reference signal of a target circuit with a test signal, and generating a binary count output according to result of the comparison;

b) according to logic states of bits of the binary count output, selectively enabling and disabling electrical conduction through passive components that are coupled to the target circuit and that correspond respectively to the bits of the binary count output so as to adjust the reference signal; and c) repeating steps a) and b) by varying the binary count output until the reference signal approximates the test signal.

Preferably, after step c), fuses in a fuse set that is coupled to the passive components are melted selectively in a single fuse-melting operation so as to maintain the enabled and disabled states of electrical conduction through the passive components in order to set the reference signal to be approximate to the test signal.

According to another aspect of the invention, there is provided a trimmer device for adjusting a reference signal of a target circuit. The trimmer device comprises:

a plurality of passive components adapted to be coupled to the target circuit;

a switch device including a plurality of transistor units, each of which is coupled to a respective one of the passive components and is operable so as to selectively enable and disable electrical conduction through the respective one of the passive components for adjusting the reference signal;

a counter coupled to the switch device and operable so as to generate a binary count output that is used to selectively turn on and turnoff the transistor units of the switch device; and a comparator circuit coupled to the counter and adapted to be coupled to the target circuit, the comparator circuit being adapted to compare the reference signal with a test signal, and generating a control signal according to result of the comparison between the reference signal and the test signal for driving the counter to vary the binary count output until the reference signal approximates the test signal.

Preferably, each of a plurality of fuses is coupled to a respective one of the passive components. The fuses are melted selectively in a single fuse-melting operation so as to maintain the enabled and disabled states of electrical conduction through the passive components in order to set the reference signal to be approximate to the test signal.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
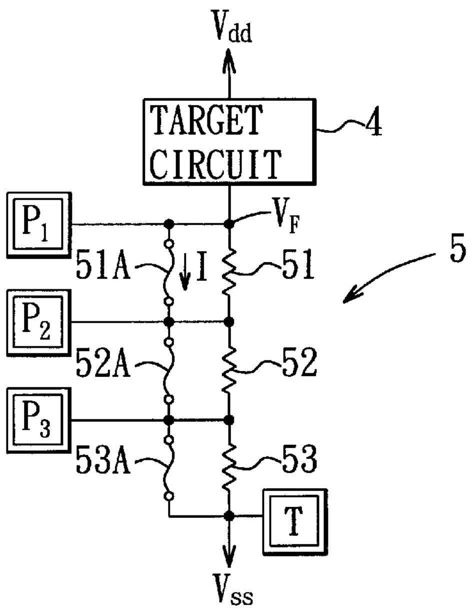
FIG. 1 PRIOR ART
FIG. 1 illustrates a conventional programmable trimmer device.
Figure 2:
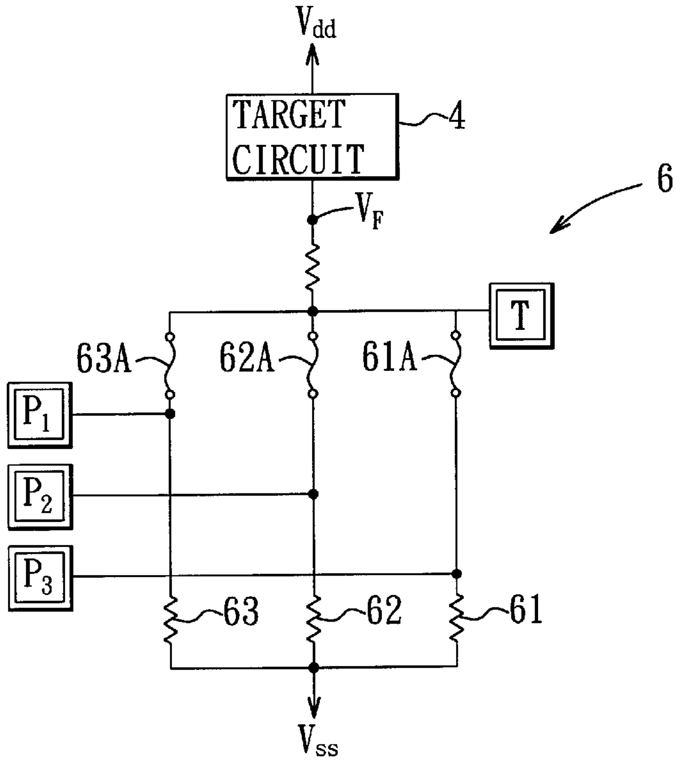
FIG. 2 PRIOR ART
FIG. 2 illustrates another conventional programmable trimmer device.

Before the present invention is described in greater detail, it should be noted that like elements are denoted by the same reference numerals throughout the disclosure.

Figure 3:
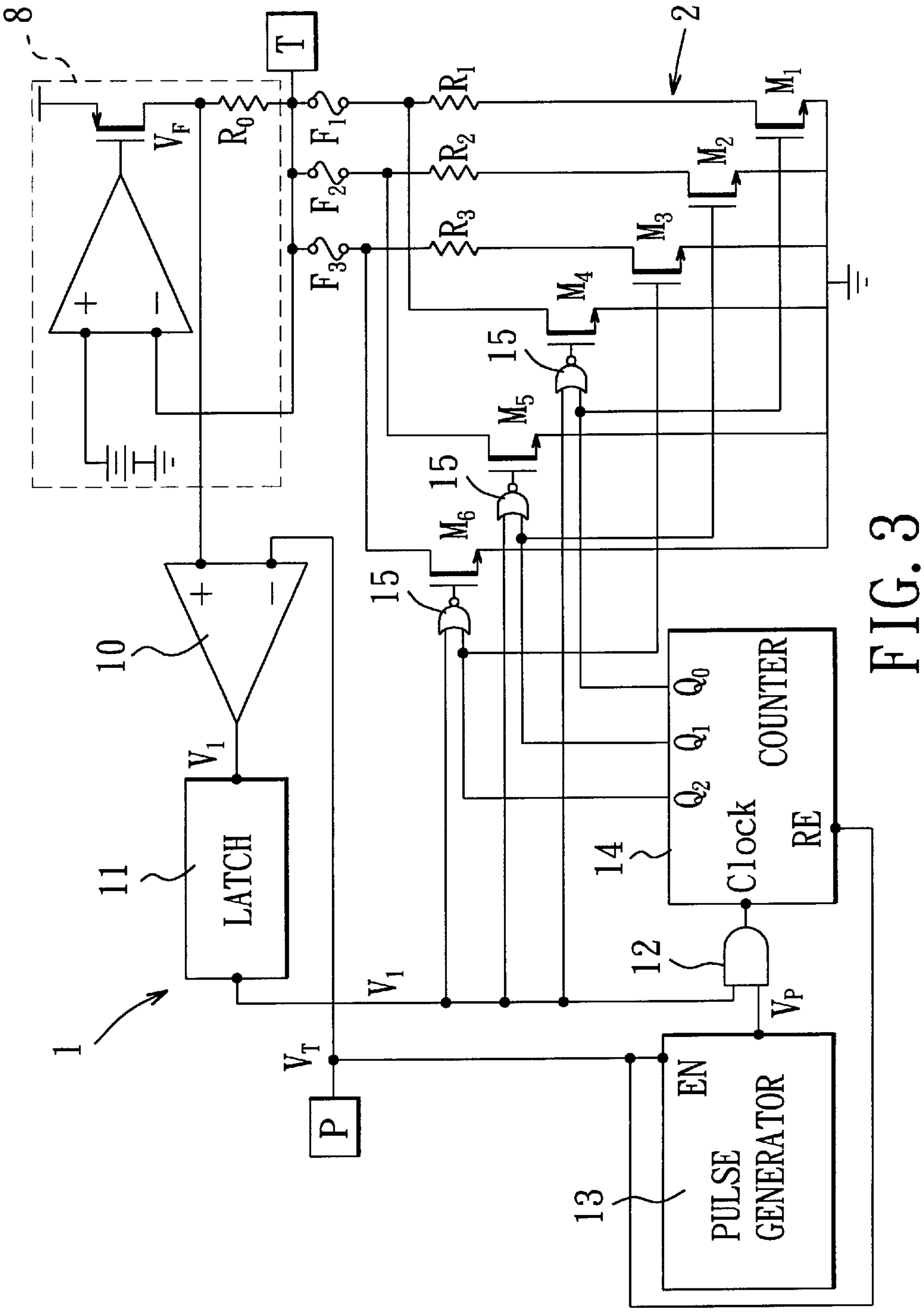
FIG. 3 illustrates the first preferred embodiment of a trimmer device according to the present invention.

Referring to FIG. 3, the first preferred embodiment of a trimmer device 1 according to the present invention is shown to be adapted for use with a target circuit 8 to adjust a reference signal, such as a reference voltage ($V_F$), of the same. In the embodiment of FIG. 3, the target circuit 8 is in the form of a low drop-out (LDO) regulator. It is noted herein that application of the trimmer device 1 to the LDO regulator is solely for illustrative purposes, and that the trimmer device 1 should not be limited for use therewith.

The trimmer device 1 includes a comparator circuit that consists of a comparator 10, a latch 11, a pulse generator 13, and a first logic gate 14. One of the inputs of the comparator 10 is coupled to a reference voltage node of the target circuit 8 for receiving the reference voltage ($V_F$) . Another of the inputs of the comparator 10 is coupled to a test signal pad (P) for receiving a test signal ($V_T$). The output of the comparator 10 is coupled to the latch 11. The comparator 10 compares the reference voltage ($V_F$) with the test signal ($V_T$), and according to the result of the comparison, provides a comparator signal ($V_1$) to the latch 11. The latch 11 serves to retain a current state of the comparator signal ($V_1$). The adjustment to be performed on the reference voltage ($V_F$) is determined by the magnitude of the test signal ($V_T$). For example, if the reference voltage ($V_F$) is designed to be 5 volts, the test signal ($V_T$) should be set to 5 volts.

The pulse generator 13 is coupled to the test signal pad (P), and is triggered by the test signal ($V_T$) so as to generate a pulse signal ($V_P$). The pulse signal ($V_P$) generated by the pulse generator 13 is preferably a periodic pulse signal or a step pulse signal. The first logic gate 12, such as an AND gate in this embodiment, is coupled to the latch 11 and the pulse generator 13. The first logic gate 12 receives the comparator signal ($V_1$) from the latch 11 and the pulse signal ($V_P$) from the pulse generator 13, and generates a control signal that is provided to a counter 14 as a result of an AND logic operation between the comparator signal ($V_1$) and the pulse signal ($V_P$). When the comparator signal ($V_1$) is at a high logic state, the first logic gate 12 will be enabled to generate the control signal, which is provided to the counter 14. On the other hand, when the comparator signal ($V_1$) is at a low logic state,the first logic gate 12 will be inhibited from providing the control signal to the counter 14.

When the first logic gate 12 provides the control signal to the counter 14, the counter 14 will be driven to vary a binary count output thereof. The counter 14 is further coupled to the test signal pad (P) so as to be capable of being reset by the test signal. ($V_T$). In this embodiment, the counter 14 is a three-bit-downward counter, and the binary count output thereof, e.g. bits $Q_2$, $Q_1$, $Q_0$, is at a maximum value of 111 when the counter 14 is reset. It should be noted that the number of bits of the binary count output of the counter 14 depends on the precision of the reference signal adjustment that is to be conducted. The higher the required precision of reference signal adjustment, the greater will be the required number of bits of the binary count output of the counter 14.

The trimmer device 1 further includes a switch device 2. The switch device 2 includes a plurality of first transistor units, and a plurality of second transistor units. Each of the first transistor units includes an N-channel MOSFET ($M_1$, $M_2$, $M_3$). Each of the second transistor units includes an N-channel MOSFET ($M_4$, $M_5$, $M_6$) and a second logic gate 15, which is a two-input NOR gate in this embodiment. Each of the transistors ($M_1$, $M_2$, $M_3$, $M_4$, $M_5$, $M_6$) has a gate, a drain and a source. The transistors ($M_1$, $M_2$, $M_3$) have their gates coupled to the counter 14 such that each of the transistors ($M_1$, $M_2$, $M_3$) can be selectively turned on and turned off under the control of a corresponding bit ($Q_2$, $Q_1$, $Q_0$) of the binary count output of the counter 14. Each of the second logic gates 15 has a first input coupled to the latch 11 for receiving the comparator signal ($V_1$), and a second input coupled to the counter 14 such that each of the logic gates 15 further receives a corresponding bit ($Q_2$, $Q_1$, $Q_0$) of the binary count output of the counter 14. The transistors ($M_4$, $M_5$, $M_6$) have their gates coupled to the second logic gates 15, respectively. Thus, each of the transistors ($M_4$, $M_5$, $M_6$) can be selectively turned on and turned off under the control of the respective one of the second logic gates 15.

In this embodiment, the drain of each of the transistors ($M_1$, $M_2$, $M_3$) is coupled to one end of a respective passive component, such as a resistor ($R_1$, $R_2$, $R_3$). The other end of each passive component ($R_1$, $R_2$, $R_3$) is coupled to a respective fuse ($F_1$, $F_2$, $F_3$) and to the drain of a respective one of the transistors ($M_4$, $M_5$, $M_6$). Each fuse ($F_1$, $F_2$, $F_3$) is coupled to the reference voltage node of the target circuit 8 through a passive component, such as a resistor ($R_O$) of the target circuit 8. It is noted that the numbers of the transistors ($M_1$, $M_2$, $M_3$, $M_4$, $M_5$, $M_6$), the second logic gates 15, the passive components ($R_1$, $R_2$, $R_3$) , and the fuses ($F_1$, $F_2$, $F_3$) employed in the trimmer device 1 of this embodiment actually depend on the number of bits of the binary count output of the counter 14 and should not be limited to those illustrated in the accompanying drawings.

Figure 4:
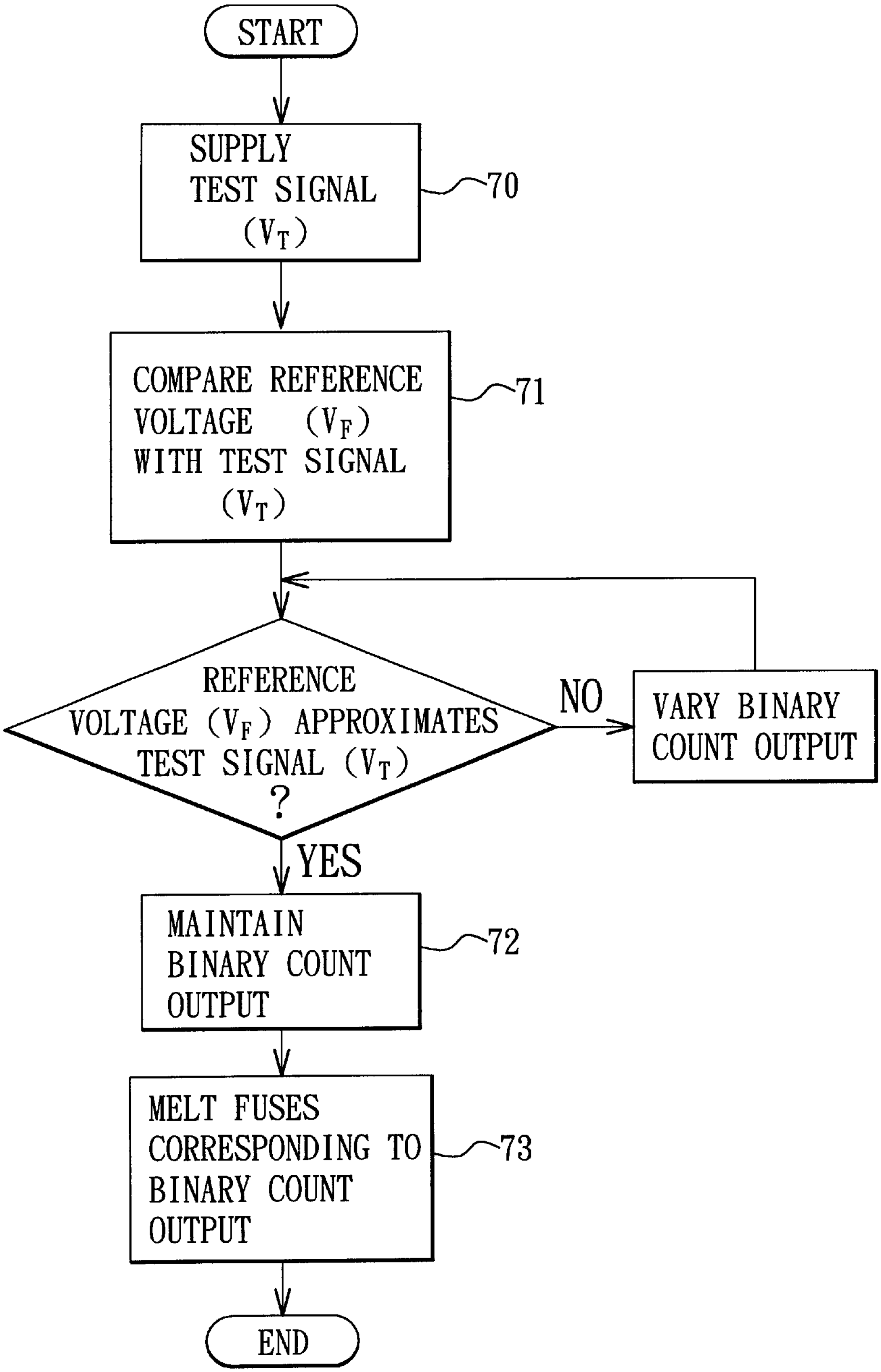
FIG. 4 illustrates consecutive steps of the trimmer method of this invention.

The trimmer method of this invention will now be described in greater detail with further reference to FIG. 4.

Initially, the test signal ($V_T$) is supplied at the test signal pad (P) at step 70. The pulse generator 13 is triggered to generate the pulse signal ($V_P$), and the counter 14 is reset at this time. Then, at step 71, the comparator 10 compares the reference voltage ($V_F$) of the target circuit 8 with the test signal ($V_T$), and provides the comparator signal ($V_1$) based on the result of the comparison. Assuming that the reference voltage ($V_F$) is initially greater than the test-signal ($V_T$), the comparator signal ($V_1$) will be at a high logic state. When the comparator signal ($V_1$) is at the high logic state, the state of the control signal from the first logic gate 12 depends on the pulse signal ($V_P$) from the pulse generator 13. Particularly, during a first clock pulse of the pulse signal ($V_P$), the binary count output of the counter 14 is at the maximum value, i.e., $Q_2Q_1Q_0$=111. At this time, the transistors ($M_1$, $M_2$, $M_3$) will be turned on, whereas the transistors ($M_4$, $M_5$, $M_6$) will be turned off. Electrical conduction through the passive components ($R_1$, $R_2$, $R_3$) is possible at this time such that electrical current can flow through three separate branches: the first branch being constituted by the fuse ($F_1$) , the passive component ($R_1$) , and the transistor ($M_1$) the second branch being constituted by the fuse ($F_2$), the passive component ($R_2$) , and the transistor ($M_2$); and the third branch being constituted by the fuse ($F_3$), the passive component ($R_3$), and the transistor ($M_3$). No change in the reference voltage ($V_F$) occurs at this time.

The high logic state of the comparator signal ($V_1$) will be maintained by the comparator 10 as long as the reference voltage ($V_F$) is greater than the test signal ($V_T$). Thus, during a second clock pulse of the pulse signal ($V_P$), the binary count output of the counter 14 is decremented by one unit, i.e., $Q_2Q_1Q_0$=110. At this time, the transistor ($M_1$) will be turned off, the transistors ($M_2$, $M_3$) will be turned on, and the transistors ($M_4$, $M_5$, $M_6$) remain turned off. Electrical conduction is possible through the passive components ($R_2$, $R_3$) and is not possible through the passive component ($R_1$) such that electrical current can flow through the second and third branches but not through the first branch. The reference voltage ($V_F$) is lowered accordingly at this time.

By repeating the above steps, when the binary count output of the counter 14 becomes 100, the transistor ($M_3$) is turned on, and the transistors ($M_1$, $M_2$, $M_4$, $M_5$, $M_6$) are turned off. Electrical conduction is possible through the passive component ($R_3$) and is not possible through the passive components ($R_1$, $R_2$) such that electrical current can flow through the third branch but not through the first and second branches. At this time, assuming that the reference voltage ($V_F$) has been lowered so as to be approximate to and not greater than the test signal ($V_T$) the logic state of the comparator signal ($V_1$) from the comparator 10 will change to a low logic state. Therefore, at step 72, the first logic gate 12 will inhibit the pulse signal ($V_P$) from the pulse generator 13 to stop driving the counter 14 from varying the binary count output further. The binary count output of the counter 14 is accordingly maintained at 100, and the transistors ($M_4$, $M_5$) will be turned on and the transistor ($M_6$) will remain turned off by virtue of the NOR logic operation between the comparator signal ($V_1$) and the corresponding bit ($Q_0$, $Q_1$, $Q_2$) of the binary count output of the counter 14 as performed by the second logic gates 15.

Subsequently, at step 73, energy in the form of voltage or current is applied to a pad (T) that is coupled to the fuses ($F_1$, $F_2$, $F_3$). Because the transistors ($M_4$, $M_5$) are turned on, paths are provided for passage of the applied energy so as to melt the fuses ($F_1$, $F_2$) that are coupled to the transistors ($M_4$, $M_5$). The fuse ($F_3$) can be prevented from melting because the passive component ($R_3$) is not bypassed by the transistor ($M_6$) at this time. Once the fuses ($F_1$, $F_2$) are melted, the disabled state of electrical conduction through the passive components ($R_1$, $R_2$) and the enabled state of electrical conduction through the passive component ($R_3$) can be maintained in order to set the reference signal ($V_F$) to be approximate to the test signal ($V_T$). Adjustment of the reference voltage ($V_F$) to the test signal ($V_T$) is completed accordingly.

It is apparent from the foregoing that the trimmer device 1 has an automatic voltage-adjusting mechanism, is capable of automatic selection of fuses to be melted, and permits simultaneous melting of the selected fuses in a single fuse-melting operation. Therefore, adjustment can be conducted in a quick and convenient manner. Moreover, regardless of the number of passive components employed in the trimmer device 1, no more than two contact pads are required: one contact pad (P) for the supply of the test signal ($V_T$), and one contact pad (T) for the supply of energy that is required to melt the selected fuses. Thus, the space utilized by the contact pads (P, T) in an integrated circuit that incorporates the trimmer device 1 is relatively small.

Figure 5:
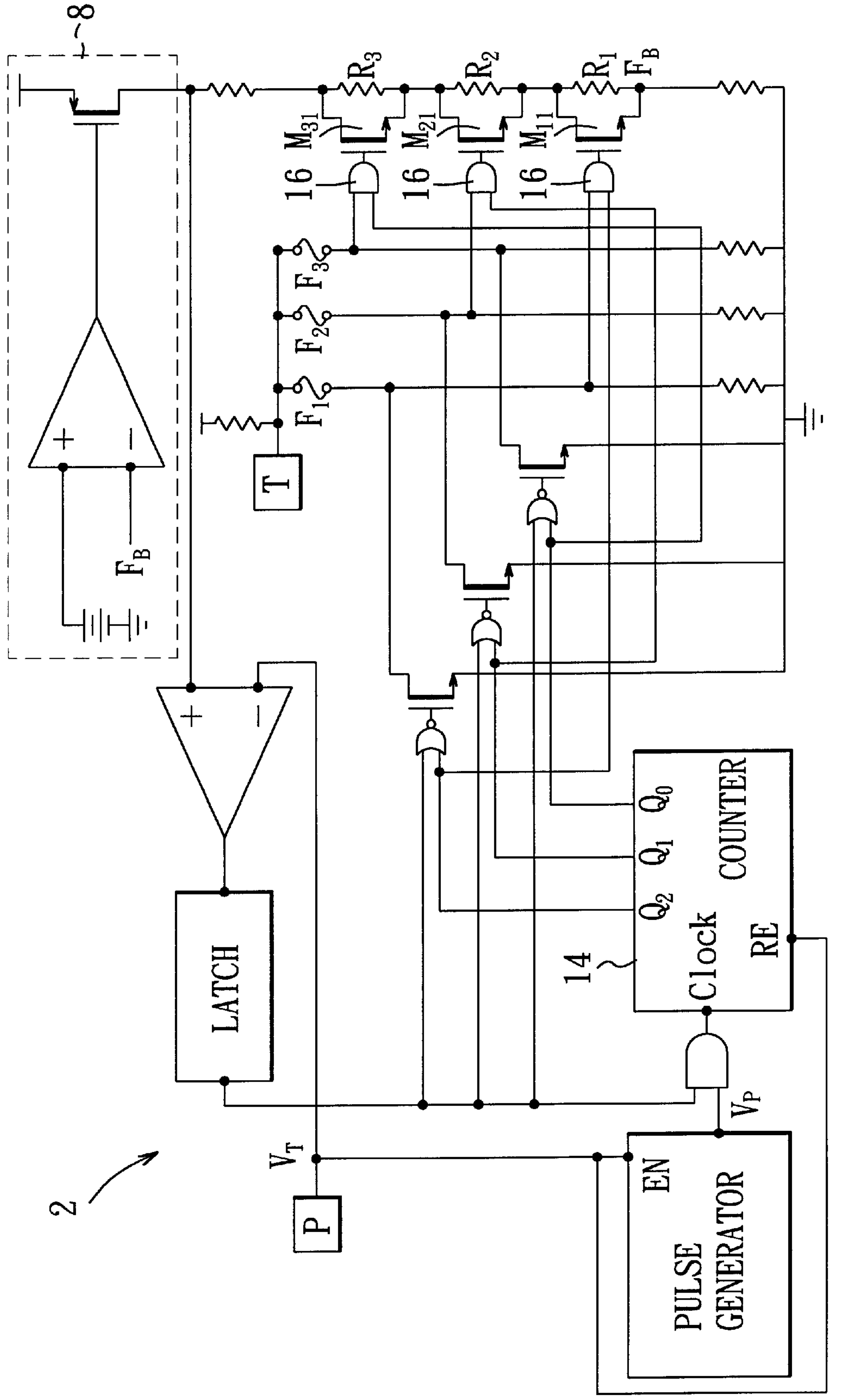
FIG. 5 illustrates the second preferred embodiment of a trimmer device according to the present invention.

FIG. 5 illustrates the second preferred embodiment of a trimmer device 2 according to this invention. Unlike the previous embodiment, the passive components ($R_1$, $R_2$, $R_3$) are connected in series to the target circuit 8. Each of the first transistor units includes an N-channel MOSFET ($M_{11}$, $M_{21}$, $M_{31}$) connected across a respective one of the passive components ($R_1$, $R_2$, $R_3$) and a third logic gate 16, such as an AND logic gate, having a first input connected to a respective one of the fuses ($F_1$, $F_2$, $F_3$) , a second input connected to the counter 14, and an output connected to the gate of the respective transistor ($M_{11}$, $M_{21}$, $M_{31}$). Since the operation of the trimmer device 2 is analogous to that of the previous embodiment, a detailed description of the same is omitted herein for the sake of brevity.

Figure 6:
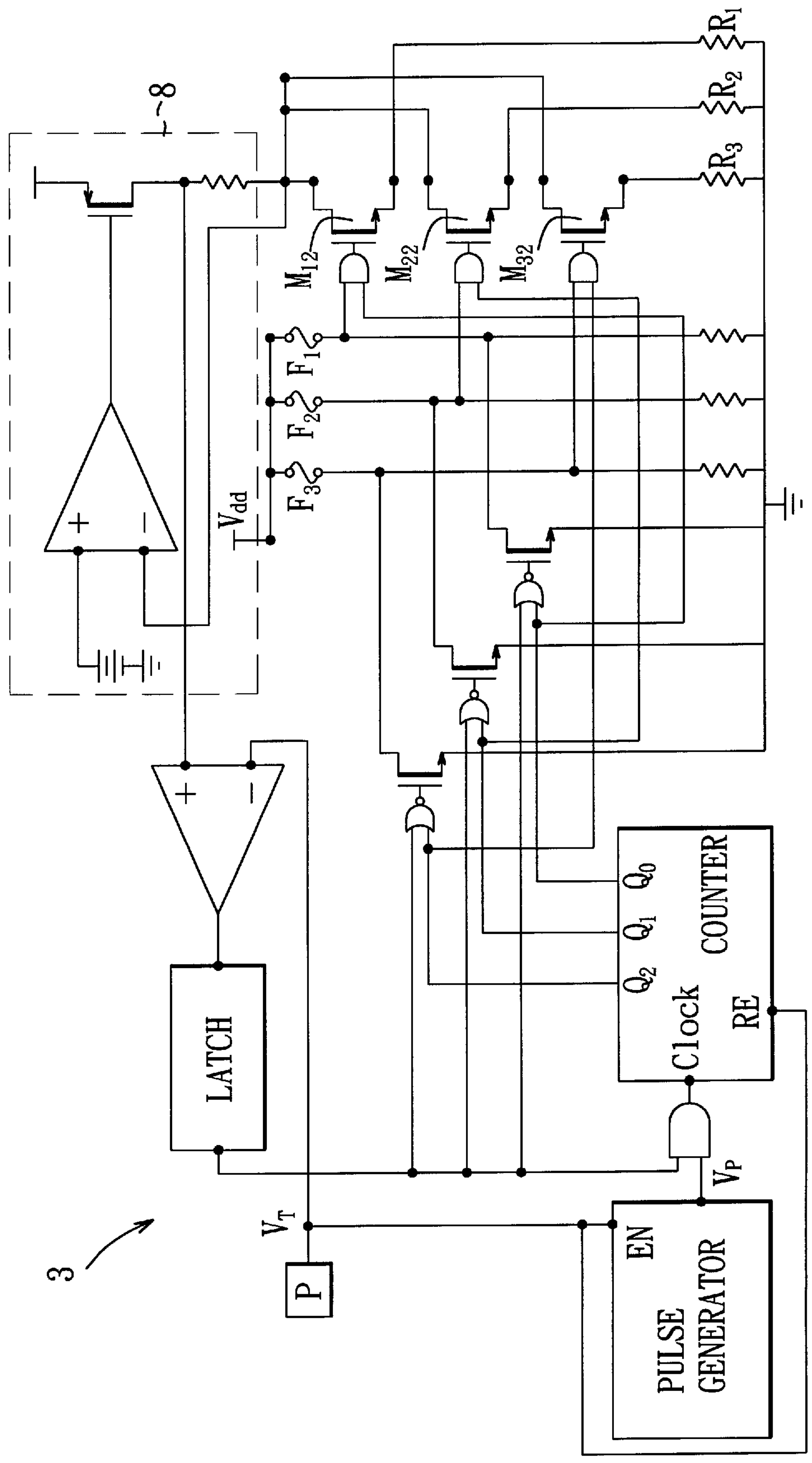
FIG. 6 illustrates the third preferred embodiment of a trimmer device according to the present invention.

FIG. 6 illustrates the third preferred embodiment of a trimmer device 3 according to this invention. Unlike the embodiment of FIG. 3, the passive components ($R_1$, $R_2$, $R_3$) are connected to the target circuit 8 via a respective one of the first transistor units ($M_{12}$, $M_{22}$, $M_{32}$). Moreover, the fuses ($F_1$, $F_2$, $F_3$) are not connected to a contact pad but are instead connected to a voltage source (Vdd) of the target circuit 8, which supplies the energy for the fuse-melting operation. In this way, only one contact pad (P) for the supply of the test signal ($V_T$) is required in the trimmer device 3. Since the operation of the trimmer device 3 is similar to that of the trimmer device 1 of FIG. 3, a description of the same will not be provided herein.

Figure 7:
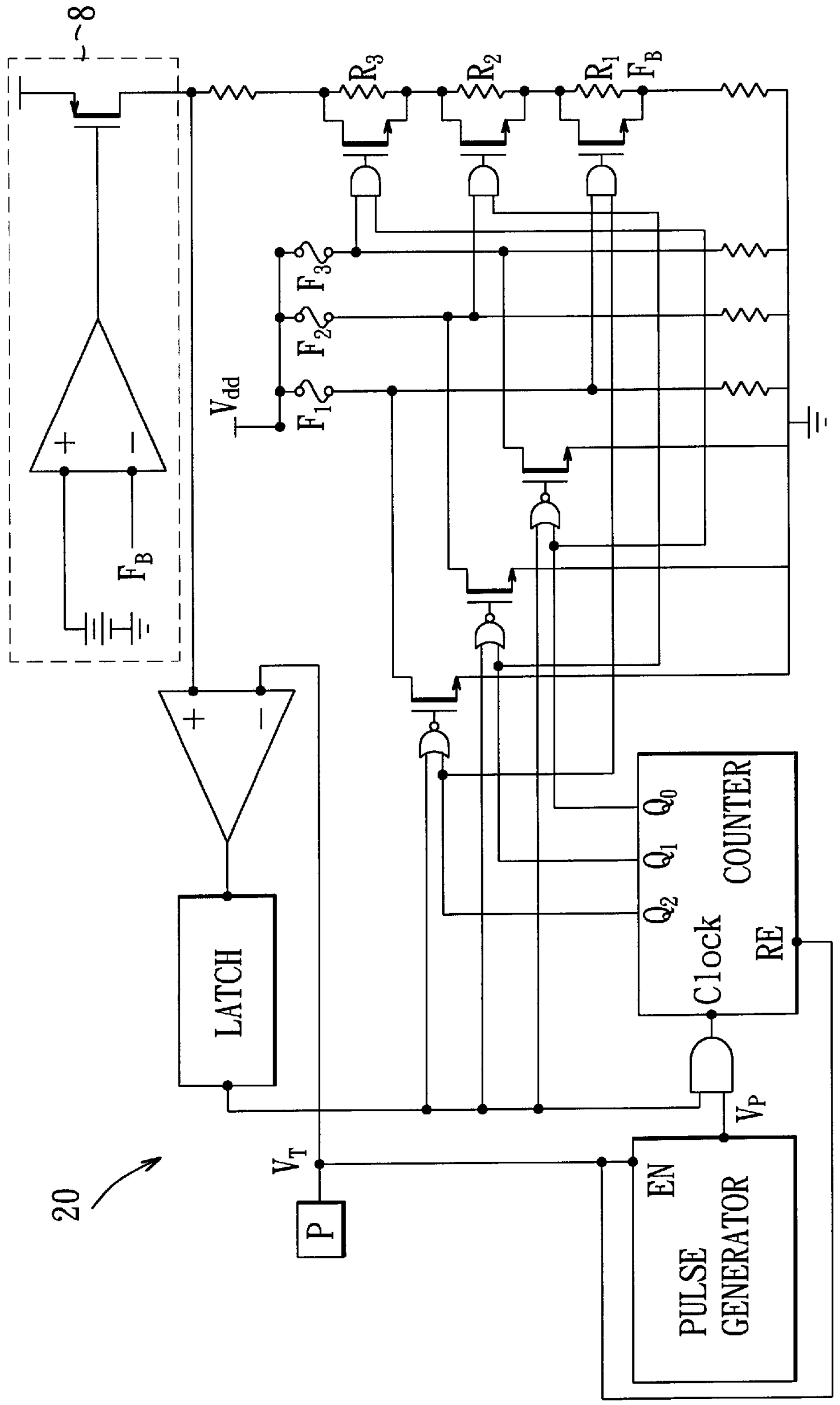
FIG. 7 illustrates the fourth preferred embodiment of a trimmer device according to the present invention.

FIG. 7 illustrates the fourth preferred embodiment of a trimmer device 20 according to this invention. Unlike the embodiment of FIG. 5, the fuses ($F_1$, $F_2$, $F_3$) are not connected to a contact pad but are instead connected to a voltage source (Vdd) of the target circuit 8 for the supply of the energy required during the fuse-melting operation.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

We claim:

1. A trimmer method comprising:

a) comparing a reference signal of a target circuit with a test signal, and generating a binary count output according to result of the comparison;

b) according to logic states of bits of the binary count output, selectively enabling and disabling electrical conduction through passive components that are coupled to the target circuit and that correspond respectively to the bits of the binary count output so as to adjust the reference signal; and c) repeating steps a) and b) by varying the binary count output until the reference signal approximates the test signal.

2. The trimmer method as claimed in claim 1, further comprising, after step c), the step of selectively melting fuses in a fuse set that is coupled to the passive components so as to maintain the enabled and disabled states of electrical conduction through the passive components in order to set the reference signal to be approximate to the test signal.

3. The trimmer method as claimed in claim 1, wherein step a) includes:

generating a comparator signal according to the result of the comparison between the reference signal and the test signal; and performing a logic operation between the comparator signal and a pulse signal derived from the test signal to result in a control signal for driving a counter to generate the binary count output that is varied until the reference signal approximates the test signal.

4. The trimmer method as claimed in claim 1, wherein electrical conduction through the respective one of the passive components is enabled when the corresponding one of the bits of the binary count output is at a first logic state, and is disabled when the corresponding one of the bits of the binary count output is at a second logic state.

5. The trimmer method as claimed in claim 4, wherein the first logic state is a high logic state, and the second logic state is a low logic state.

6. A trimmer device for adjusting a reference signal of a target circuit, said trimmer device comprising:

a plurality of passive components adapted to be coupled to the target circuit;

a switch device including a plurality of first transistor units, each of which is coupled to a respective one of said passive components and is operable so as to selectively enable and disable electrical conduction through the respective one of said passive components for adjusting the reference signal;

a counter coupled to said switch device and operable so as to generate a binary count output that is used to selectively turn on and turn off said first transistor units of said switch device; and a comparator circuit coupled to said counter and adapted to be coupled to the target circuit, said comparator circuit being adapted to compare the reference signal with a test signal, and generating a control signal according to result of the comparison between the reference signal and the test signal for driving said counter to vary the binary count output until the reference signal approximates the test signal.

7. The trimmer device as claimed in claim 6, wherein said comparator circuit includes:

a comparator adapted to be coupled to the target circuit, said comparator being adapted to compare the reference signal with the test signal, and generating a comparator signal according to the result of the comparison between the reference signal and the test signal;

a pulse generator adapted to be triggered by the test signal so as to generate a pulse signal, and a first logic gate coupled to said comparator and said pulse generator and operable so as to generate the control signal as a result of a first logic operation between the comparator signal and the pulse signal;

wherein a change in logic state of the comparator signal when the reference signal approximates the test signal inhibits said first logic gate from generating the control signal to stop driving said counter from varying the binary count output.

8. The trimmer device as claimed in claim 7, wherein said first logic gate is an AND gate.

9. The trimmer device as claimed in claim 6, wherein said passive components are resistive components.

10. The trimmer device as claimed in claim 6, further comprising a plurality of fuses, each of which is coupled to a respective one of said passive components, said fuses being melted selectively so as to maintain the enabled and disabled states of electrical conduction through said passive components in order to set the reference signal to be approximate to the test signal.

11. The trimmer device as claimed in claim 10, wherein said switch device further includes a plurality of second transistor units coupled to said fuses respectively, said second transistor units being coupled to said counter and being controlled by the comparator signal and a corresponding bit of the binary count output of said counter so as to provide a path for passage of energy when the respective one of said fuses is selected for melting.

12. The trimmer device as claimed in claim 11, wherein each of said second transistor units includes a transistor coupled to the respective one of said fuses, and a second logic gate coupled to said transistor and performing a second logic operation between the comparator signal and the corresponding bit of the binary count output of said counter for controlling turning on and turning off of said transistor.

13. The trimmer device as claimed in claim 12, wherein said second logic gate is a NOR gate.

14. A trimmer device for adjusting a reference signal of a target circuit, said trimmer device comprising:

a plurality of passive components adapted to be coupled to the target circuit;

a plurality of first transistor units, each of which is coupled to a respective one of said passive components and is operable so as to selectively enable and disable electrical conduction through the respective one of said passive components for adjusting the reference signal;

a counter coupled to said first transistor units and operable so as to generate a binary count output that is used to selectively turn on and turn off said first transistor units;

a comparator adapted to be coupled to the target circuit and adapted to compare the reference signal with a test signal, said comparator generating, a comparator signal according to result of the comparison between the reference signal and the test signal;

a pulse generator adapted to be triggered by the test signal so as to generate a pulse signal;

a first logic gate coupled to said comparator and said pulse generator, and operable so as to generate a control signal as a result of a first logic operation between the comparator signal and the pulse, signal, the control signal being provided to said counter for driving said counter to vary the binary count output, a change in logic state of the comparator signal when the reference signal approximates the test signal inhibiting said first logic gate from generating the control signal to stop driving said counter from varying the binary count output;

a plurality of fuses, each of which is coupled to a respective one of said passive components, said fuses being melted selectively so as to maintain the enabled and disabled states of electrical conduction through said passive components in order to set the reference signal to be approximate to the test signal; and a plurality of second transistor units, each of which is coupled to said counter and to a respective one of said fuses, each of said second transistor units being controlled by the comparator signal and a corresponding bit of the binary count output of said counter so as to provide a path for passage of energy when the respective one of said fuses is selected for melting.

15. The trimmer device as claimed in claim 14, wherein each of said second transistor units includes a transistor coupled to the respective one of said fuses, and a second logic gate coupled to said transistor and performing a second logic operation between the comparator signal and the corresponding bit of the binary count output of said counter for controlling turning on and turning off of said transistor.

16. The trimmer device as claimed in claim 15, wherein said second logic gate is a NOR gate.

17. The trimmer device as claimed in claim 14, wherein said passive components are resistive components.

18. The trimmer device as claimed in claim 14, wherein said first logic gate is an AND gate.

19. The trimmer device as claimed in claim 14, wherein each of said first and second transistor units includes an n-channel MOSFET.

20. The trimmer device as claimed in claim 14, wherein said first transistor units correspond respectively to the bits of the binary count output of said counter, each of said first transistor units enabling electrical conduction through the respective one of said passive components when the corresponding one of the bits of the binary count output is at a first logic state, and disabling electrical conduction through the respective one of said passive components when the corresponding one of the bits of the binary count output is at a second logic state.

21. The trimmer device as claimed in claim 20, wherein the first logic state is a high logic state, and the second logic state is a low logic state.

* * * * *